United States Patent [19]

Sorrells et al.

[11] Patent Number: 5,336,940
[45] Date of Patent: Aug. 9, 1994

[54] DELAY-COMPENSATED OUTPUT PAD FOR AN INTEGRATED CIRCUIT AND METHOD THEREFOR

[75] Inventors: Peter H. Sorrells, Chandler; Ned D. Garinger, Tempe, both of Ariz.

[73] Assignee: VLSI Technology, Inc., San Jose, Calif.

[21] Appl. No.: 926,981

[22] Filed: Aug. 7, 1992

[51] Int. Cl.$^5$ ............................ H03K 5/13; H03K 5/24
[52] U.S. Cl. ................................... 307/269; 307/359; 307/606; 328/55
[58] Field of Search ............... 307/264, 358, 493, 591, 307/597, 601, 603, 606, 269, 359; 328/55, 56, 77, 155

[56] References Cited

U.S. PATENT DOCUMENTS 4,985,639  1/1991  Renfrow et al. ..................... 328/55

Primary Examiner—Timothy P. Callahan
Assistant Examiner—Shawn Riley
Attorney, Agent, or Firm—Harry M. Weiss & Associates

[57] ABSTRACT

An output pad for an integrated circuit includes circuitry to fix the output delay to a constant value even when changes occur in power supply voltage, manufacturing process and temperature. This output pad has a closed-loop feedback circuit which controls the delay of the output signal through an Adjustable Output Driver. A Fixed Delay Element provides a reference delay that does not change with induced variations. The loop adjusts the delay of the Adjustable Output Driver until the edge of the signal delayed by the Adjustable Output Driver is coincident with the edge of the signal delayed by the Fixed Delay Element within a defined tolerance. In a second embodiment the output pad has a Variable Delay Element with programmable delay values that remain constant over induced variations. In a third embodiment the Fixed Delay Element is deleted, and the delayed signal through the Adjustable Output Driver is compared to and therefore synchronized with a Reference Signal, which may be provided on-chip or from a source external to the chip.

10 Claims, 2 Drawing Sheets

DELAY-COMPENSATED OUTPUT PAD FOR AN INTEGRATED CIRCUIT AND METHOD THEREFOR

RELATED APPLICATION

This patent application is related to another U.S. patent application entitled "Self-Compensating Output Pad for an Integrated Circuit and Method Therefor" by inventors Murray, Garinger and Sorrells, which is assigned to the same assignee as this patent application.

1. Field of the Invention

This invention generally relates to integrated circuits and methods, and, more specifically, relates to an output pad for an integrated circuit and method therefor for providing an output delay that is constant over variations in power supply voltage, manufacturing process and temperature.

2. Description of the Prior Art

Compensated digital delay lines are necessary for certain high-speed applications, including DRAM control in modern PC/AT computer systems. But even the best-compensated, most accurate delay line is only as good as its output pad, if the delayed signals are to be used off-chip. The pad driver itself introduces an uncontrolled delay into the path which changes with variations in power supply voltage, manufacturing process and temperature. Prior art integrated circuits used no delay compensation at the output pad. The resultant variation in output delay caused the need for wide margin in timing specifications and prevented high-speed operation of the integrated circuit.

Therefore, there existed a need to provide a delay-compensated output pad and method which maintains a constant delay across the output pad driver and which does not vary over variations in power supply voltage, manufacturing process or temperature. This delay compensation allows designing digital systems that operate at a higher speed than was previously possible.

SUMMARY OF THE INVENTION

It is an object of this invention to provide an output pad for an integrated circuit and method therefor which provides a fixed delay over variations in power supply voltage, manufacturing process and temperature.

It is another object of this invention to provide an output pad for an integrated circuit and method therefor which provides a variable delay which is constant over variations in power supply voltage, manufacturing process and temperature.

It is a further object of this invention to provide an output pad for an integrated circuit and method therefor which provides a delay relative to a reference signal which is constant over variations in power supply voltage, manufacturing process and temperature.

According to the first embodiment of the present invention, an output pad for an integrated circuit is provided. This output pad has circuitry that provides a known, fixed delay across the output driver. This is accomplished by providing a Fixed Delay Element and an Adjustable Output Driver which both have as inputs the Input Signal of interest. The output of the Fixed Delay Element is compared to the output of the Adjustable Output Driver using an Edge Compare circuit. The output of the Edge Compare circuit controls the Output Control circuit, which adjusts the Adjustable Output Driver to have more or less delay until the output edge of the Fixed Delay Element and the output edge of the Adjustable Output Driver are coincident within a predetermined tolerance.

The output pad of the present invention can provide a fixed delay at the output driver that is insensitive to induced changes provided it has a Fixed Delay Element reference that is also insensitive to induced changes. Certain applications may benefit from having a variable delay across the Adjustable Output Driver, provided the delay is known and fixed over induced variations. According to the second embodiment of the present invention, the Fixed Delay Element is actually a Variable Delay Element that has a delay that is determined by a Control Word on its input. Even though the Variable Delay Element can change the delay of the Adjustable Output Driver, it does so in a known manner, without being affected by induced variations. For this reason, the Variable Delay Element is still "fixed" with respect to induced variations.

In a third embodiment of the present invention, the output edge of the Adjustable Output Driver is compared to an edge of a Reference Signal, and adjusted to be coincident with this Reference Signal within a predetermined tolerance. In this manner the output is synchronized to the occurrence of the Reference Signal.

The foregoing and other objects, features and advantages will be apparent from the following description of the preferred embodiment of the invention as illustrated in the accompanying drawings.

DESCRIPTION OF THE PREFERRED EMBODIMENT

Figure 1:
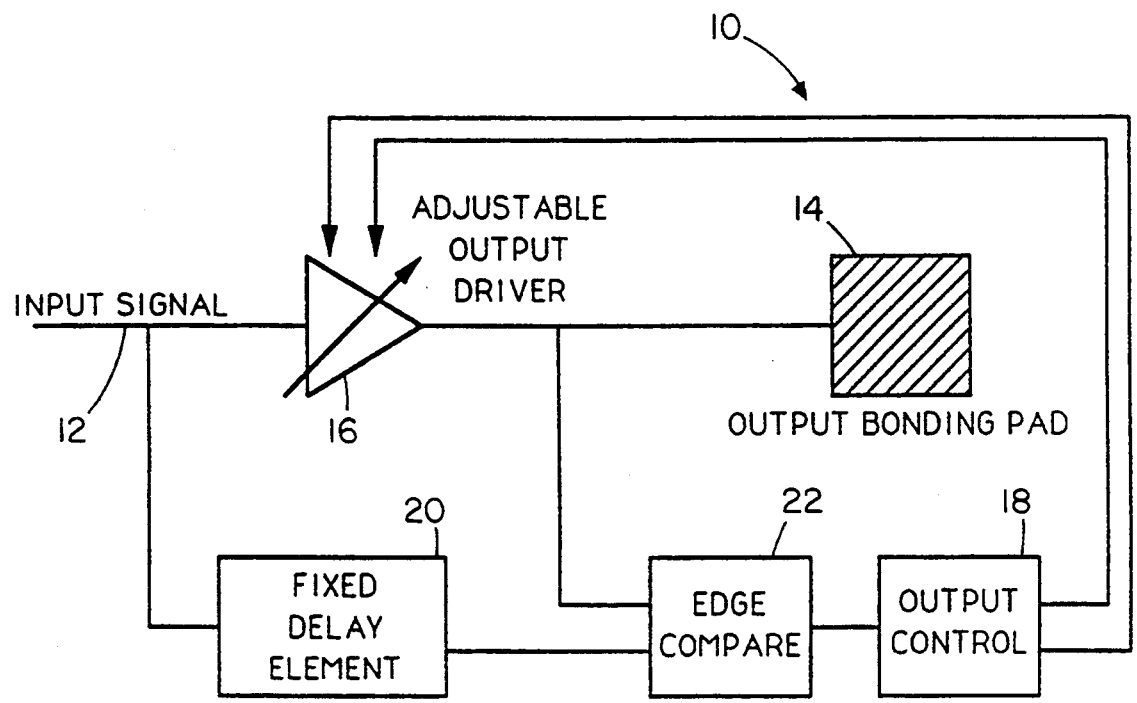
FIG. 1 is a schematic block diagram of the output pad of the present invention.

FIG. 1 shows the configuration of the output pad 10 according to the first embodiment of the present invention. Input Signal 12 is the signal of interest on the integrated circuit that is normally connected through an output driver to Output Bonding Pad 14 in prior art integrated circuits. An Adjustable Output Driver 16 is provided, which is controlled by an Output Control circuit 18. A Fixed Delay Element 20 delays Input Signal 18 by a known amount that does not change with induced variations. An Edge Compare circuit 22 compares the edge of the signal on the output of the Adjustable Output Driver 16 with the edge of the delayed signal on the output of the Fixed Delay Element 20. If the edge of the output of Fixed Delay Element 20 arrives first, Edge Compare circuit 22 causes Output Control circuit 18 to decrease the delay through the Adjustable Output Driver 16. If the output edge of Adjustable Output Driver 16 arrives first, Edge Compare circuit 22 causes Output Control circuit 18 to increase the delay through the Adjustable Output Driver 16. This adjustment process continues until the output edge of Adjustable Output Driver 16 and the output edge of Fixed Delay Element 20 are coincident within a predetermined threshold.

Fixed Delay Element 20 provides a reference that does not change delay with induced variations. One example of a fixed delay element is a Self-Compensating Digital Delay Semiconductor Device as disclosed in U.S. patent application No. 07/843,488, which has a filing date of Feb. 28, 1992. The particular implementation of a fixed delay element in the reference patent application is incorporated into this invention by reference thereto. The delay tolerance of the Fixed Delay Element 20 coupled with the allowable tolerance between the output of the Fixed Delay Element 20 and the Adjustable Output Driver 16 determine the delay tolerance of the Output Pad 10.

Figure 2:
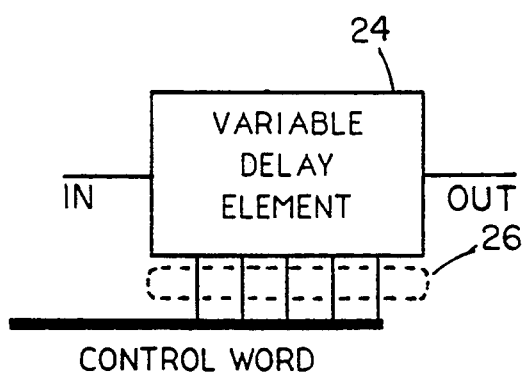
FIG. 2 is a block diagram schematic of the Variable Delay Element used in the second embodiment of the present invention.

In the second embodiment of the present invention, the Fixed Delay Element 20 of FIG. 1 is replaced by a Variable Delay Element 24 as shown in FIG. 2. Variable Delay Element 24 has an input and output as shown, but also has an input whereby a Control Word 26 can change the delay from input to output. Even though the delay from input to output changes with respect to the Control Word 26, the delay from input to output remains constant with respect to induced variations for any given Control Word 26. This configuration allows the user of the integrated circuit or some other circuitry to set the desired delay across the Adjustable Output Driver 16 to a number of difference values by selecting the appropriate Control Word 26.

Figure 3:
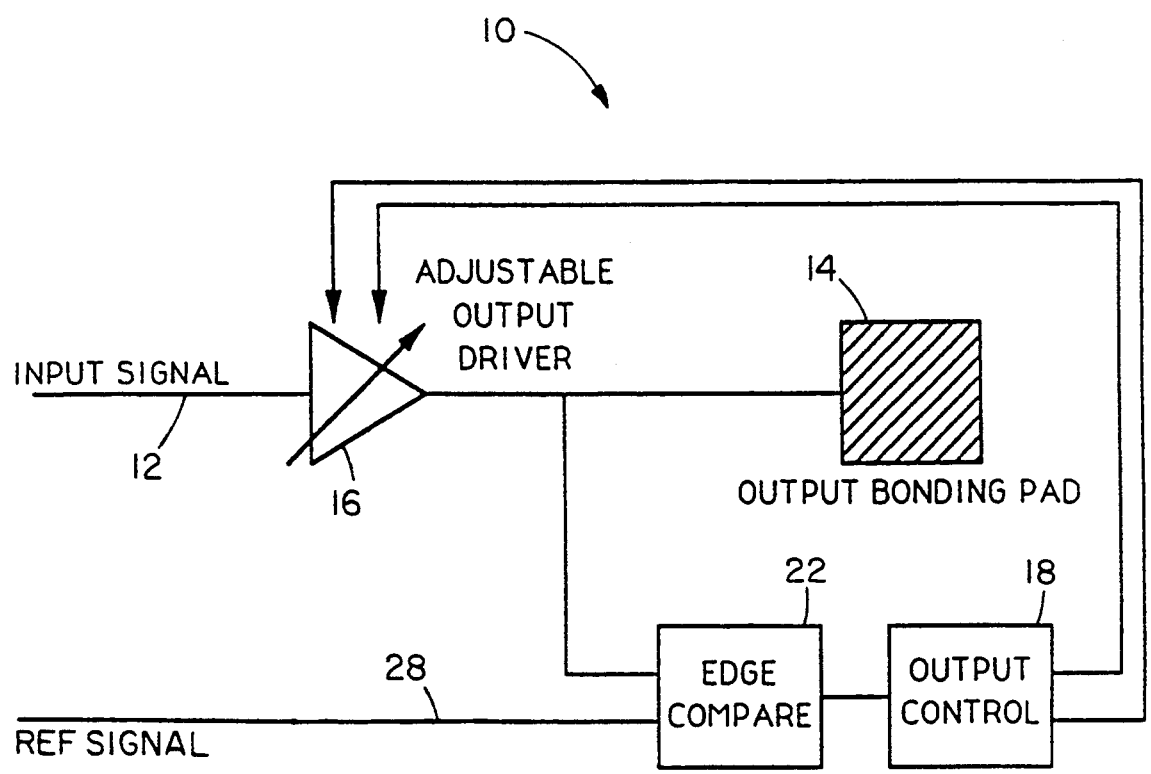
FIG. 3 is a block diagram schematic of the third embodiment of the present invention which synchronizes the Input Signal to a Reference Signal.

The third embodiment of the output pad 10 of the present invention is shown in FIG. 3. In this configuration the Edge Compare circuit 22 compares the delayed input signal edge at the output of the Adjustable Output Driver 16 to a Reference Signal 28 from elsewhere on the integrated circuit, or from a bonding pad that connects to a signal external to the integrated circuit. In this manner the Input Signal 12 is delayed by Adjustable Output Driver 16 and made coincident with (and therefore synchronous to) the Reference Signal 28.

The particular implementation of Adjustable Output Driver 16 can vary according to the application. This driver could be controlled by either digital outputs or analog outputs of Output Control 18. In either case, the gain of the Adjustable Output Driver 18 is the parameter that is adjusted, which is inversely proportional to the delay. Thus is less delay is needed, the Output Control 18 will increase the gain of Adjustable Output Driver 16. Likewise, if more delay is needed, the Output Control 18 will decrease the gain of Adjustable Output Driver 16.

While the invention has been described in its preferred embodiment, it is to be understood that the words which have been used are words of description rather than limitation, and that changes may be made within the purview of the appended claims without departing from the true scope and spirit of the invention in its broader aspects.

What is claimed is:

1. An output pad for an integrated circuit comprising, in combination:
   circuitry means for driving a logic output of said integrated circuit to a conductor external to said integrated circuit;
   first input means for providing said logic output from said integrated circuit to said circuitry means, said circuitry means delaying said logic output thereby providing a delayed output signal, said circuitry means providing a delay within a predetermined tolerance which does not substantially vary with variations in power supply voltage, temperature and manufacturing process; and
   output means coupled to said circuitry means for coupling said delayed output signal to said conductor;
   said circuitry means comprising, in combination:
   adjustable output driver means having an input coupled to said first input means and having an output coupled to said output means for driving said logic output on said first input means to said output means thereby providing said delay;
   delay means having an input coupled to said first input means for delaying said logic output;
   edge detector means coupled to said output of said adjustable output driver means and to an output of said delay means for detecting an edge of said output of said adjustable output driver means and an edge of said output of said delay means to determine which of the two said edges occurs first, and having status output means for providing an output that changes depending on which of the two said edges occurs first; and
   output control means for changing said delay of said adjustable output driver means having an input coupled to said status output means and an output coupled to said adjustable output driver means, said output control means increasing said delay when said edge of said output of said adjustable output driver means occurs before said edge of said output of said delay means, said output control means decreasing said delay when said edge of said output of said delay means occurs before said edge of said output of said adjustable output driver means, and said output control means maintaining said delay when said edge of said output of said adjustable output driver means occurs coincident with said edge of said output of said delay means within a predetermined tolerance.

2. The output pad of claim 1 wherein said delay means having a fixed delay that does not substantially vary with variations in power supply voltage, temperature and manufacturing process.

3. The output pad of claim 1 wherein said delay means having a plurality of selectable fixed delays, each of said fixed delays being selected by an external control word, each of said fixed delays not substantially varying with variations in power supply voltage, temperature and manufacturing process.

4. An output pad for an integrated circuit comprising, in combination:
   circuitry means for driving a logic output of said integrated circuit to a conductor external to said integrated circuit;
   first input means for providing said logic output from said integrated circuit to said circuitry means, said circuitry means delaying said logic output thereby providing a delayed output signal, said circuitry means providing a delay within a predetermined tolerance which does not substantially vary with variations in power supply voltage, temperature and manufacturing process; and
   output means coupled to said circuitry means for coupling said delayed output signal to said conductor;
   said output pad further comprising second input means coupled to said circuitry means for providing a reference signal to said circuitry means, and wherein said circuitry means comprising, in combination:

adjustable output driver means having an input coupled to said first input means and having an output coupled to said output means for driving said logic output on said first input means to said output means thereby providing said delay;

edge detector means coupled to said output of said adjustable output driver means and to said reference signal for detecting an edge of said output of said adjustable output driver means and an edge of said reference signal to determine which of the two said edges occurs first, and having status output means for providing an output that changes depending on which of the two said edges occurs first; and output control means for changing said delay of said adjustable output driver means having an input coupled to said status output means and an output coupled to said adjustable output driver means, said output control means increasing said delay when said edge of said output of said adjustable output driver means occurs before said edge of said reference signal, said output control means decreasing said delay when said edge of said reference signal occurs before said edge of said output of said adjustable output driver means, and said output control means maintaining said delay when said edge of said output of said adjustable output driver means occurs coincident with said edge of said reference signal within a predetermined tolerance.

5. The output of claim 4 wherein said delay being changed by adjusting the gain of said adjustable output driver means in a manner inverse to said delay, an increase in said gain creating a decrease in said delay, and a decrease in said gain creating an increase in said delay.

6. A method for providing an output pad for an integrated circuit output having a delay that does not substantially vary with variations in power supply voltage, temperature and manufacturing process comprising the steps of:

providing circuitry means for driving said output of said integrated circuit to a conductor external to said integrated circuit;

providing first input means for providing a logic output from said integrated circuit to said circuitry means, said circuitry means delaying said logic output thereby providing a delayed output signal, said circuitry means providing a delay within a predetermined tolerance which does not substantially vary with variations in power supply voltage, temperature and manufacturing process; and providing output means coupled to said circuitry means for coupling said delayed output signal to an external conductor;

said circuitry means comprising, in combination:

adjustable output driver means having an input coupled to said first input means and having an output coupled to said output means for driving said logic output on said first input means to said output means thereby providing said delay;

delay means having an input coupled to said first input means for delaying said logic output;

edge detector means coupled to said output of said adjustable output driver means and to an output of said delay means for detecting an edge of said output of said adjustable output driver means and an edge of said output of said delay means to determine which of the two said edges occurs first, and having status output means for providing an output that changes depending on which of the two said edges occurs first; and output control means for changing said delay of said adjustable output driver means having an input coupled to said status output means and an output coupled to said adjustable output driver means, said output control means increasing said delay when said edge of said output of said adjustable output driver means occurs before said edge of said output of said delay means, said output control means decreasing said delay when said edge of said output of said delay means occurs before said edge of said output of said adjustable output driver means, and said output control means maintaining said delay when said edge of said output of said adjustable output driver means occurs coincident with said edge of said output of said delay means within a predetermined tolerance.

7. A method for providing an output pad for an integrated circuit output having a delay that does not substantially vary with variations in power supply voltage, temperature and manufacturing process comprising the steps of:

providing circuitry means for driving said output of said integrated circuit to a conductor external to said integrated circuit;

providing first input means for providing a logic output from said integrated circuit to said circuitry means, said circuitry means delaying said logic output thereby providing a delayed output signal, said circuitry means providing a delay within a predetermined tolerance which does not substantially vary with variations in power supply voltage, temperature and manufacturing process; and providing output means coupled to said circuitry means for coupling said delayed output signal to an external conductor;

said method further comprising the step of providing a reference signal to said circuitry means, and wherein said circuitry means comprising, in combination:

adjustable output driver means having an input coupled to said first input means and having an output coupled to said output means for driving said logic output on said first input means to said output means thereby providing said delay;

edge detector means coupled to said output of said adjustable output driver means and to said reference signal for detecting an edge of said output of said adjustable output driver means and an edge of said reference signal to determine which of the two said edges occurs first, and having status output means for providing an output that changes depending on which of the two said edges occurs first; and output control means for changing said delay of said adjustable output driver means having an input coupled to said status output means and an output coupled to said adjustable output driver means, said output control means increasing said delay when said edge of said output of said adjustable output driver means occurs before said edge of said reference signal, said output control means decreasing said delay when said edge of said reference signal occurs before said edge of said output of said adjustable output driver means, and said output control means maintaining said delay when said edge of said output of said adjustable output driver means occurs coincident with said edge of said reference signal within a predetermined tolerance.

8. The output pad of claim 1 wherein said output means comprising bonding pad means for connecting said delayed output signal to said conductor.

9. The output pad of claim 4 wherein said output means comprising bonding pad means for connecting said delayed output signal to said conductor.

10. An output pad for an integrated circuit comprising, in combination:

circuitry means for driving a logic output of said integrated circuit to a conductor external to said integrated circuit;

first input means for both providing said logic output from said integrated circuit as an input to an adjustable output driver of said circuitry means and as an input to a delay element of said circuitry means, said circuitry means delaying said logic output thereby providing a delayed output signal, said circuitry means providing a delay within a predetermined tolerance which does not substantially vary with variations in power supply voltage, temperature and manufacturing process; and output means coupled to said circuitry means for coupling said delayed output signal to said conductor.

* * * * *